US012568650B2

(12) United States Patent
Kang et al.

(10) Patent No.: US 12,568,650 B2
(45) Date of Patent: Mar. 3, 2026

(54) PROFILE ENGINEERING FOR DEEP TRENCHES IN A SEMICONDUCTOR DEVICE

(71) Applicant: International Business Machines Corporation, Armonk, NY (US)

(72) Inventors: Tsung-Sheng Kang, Ballston Lake, NY (US); Daniel Schmidt, Niskayuna, NY (US); Ruilong Xie, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 831 days.

(21) Appl. No.: 17/656,224

(22) Filed: Mar. 23, 2022

(65) Prior Publication Data

US 2023/0326987 A1     Oct. 12, 2023

(51) Int. Cl.
*H10D 30/67*      (2025.01)
*H10D 62/10*      (2025.01)
(Continued)

(52) U.S. Cl.
CPC ..... *H10D 30/6735* (2025.01); *H10D 30/6757* (2025.01); *H10D 62/118* (2025.01);
(Continued)

(58) Field of Classification Search
CPC .......... H10D 30/6735; H10D 30/6757; H10D 62/118; H10D 64/017; H10D 64/518; H10D 84/0151; H10D 84/038
See application file for complete search history.

(56) References Cited

U.S. PATENT DOCUMENTS

| | | | |
|---|---|---|---|
| 6,242,788 B1 | 6/2001 | Mizuo | |
| 8,384,225 B2 | 2/2013 | Rahman | |

(Continued)

FOREIGN PATENT DOCUMENTS

| | | |
|---|---|---|
| KR | 20110000203 A | 1/2011 |
| WO | 2018182627 A1 | 10/2018 |
| WO | 2019005001 A1 | 1/2019 |

OTHER PUBLICATIONS

Anonymous, "High Aspect Ratio Trench Fill", An IP.com Prior Art Database Technical Disclosure, IP.com Electronic Publication Date: Oct. 26, 2009, IP.com No. IPCOM000189045D, 2 pages.
(Continued)

*Primary Examiner* — Norman D Richards
*Assistant Examiner* — Sammantha K Salaz
(74) *Attorney, Agent, or Firm* — Gavin Giraud

(57)     ABSTRACT

A semiconductor structure includes a gate cut isolation region composed of a top portion and a bottom portion. The top portion of the gate cut isolation region being at a first taper angle and the second portion being at a second taper angle different from the first taper angle. A change from the first taper angle to the second taper angle occurs at an intersection between the top portion of the gate cut isolation region and the bottom portion of the gate cut isolation region. The semiconductor structure further includes a plurality of semiconductor channel layers adjacent to the gate cut isolation region, the plurality of semiconductor channel layers being surrounded by a metal gate stack. A top surface of an uppermost semiconductor channel layer being coplanar with the intersection between the top portion and the bottom portion of the gate cut isolation region.

20 Claims, 10 Drawing Sheets

(Section Y-Y)

(51) Int. Cl.

| | |
|---|---|
| *H10D 64/01* | (2025.01) |
| *H10D 64/27* | (2025.01) |
| *H10D 84/01* | (2025.01) |
| *H10D 84/03* | (2025.01) |

(52) U.S. Cl.
CPC ......... *H10D 64/017* (2025.01); *H10D 64/518* (2025.01); *H10D 84/0151* (2025.01); *H10D 84/038* (2025.01)

(56) References Cited

U.S. PATENT DOCUMENTS

| | | | | |
|---|---|---|---|---|
| 9,818,836 | B1 | 11/2017 | Sung | |
| 10,246,772 | B2 | 4/2019 | Jha | |
| 10,366,930 | B1 | 7/2019 | Xie | |
| 11,183,560 | B2 | 11/2021 | Cheng | |
| 2008/0153295 | A1* | 6/2008 | Chang | H01L 21/76802 |
| | | | | 438/700 |
| 2013/0009305 | A1 | 1/2013 | Oshida | |
| 2021/0098604 | A1 | 4/2021 | Lin | |
| 2022/0285346 | A1* | 9/2022 | Li | H10D 30/014 |

OTHER PUBLICATIONS

Anonymous, "Shallow Trench Isolation with Variable Topography", An IP.com Prior Art Database Technical Disclosure, IP.com No. IPCOM000262109D, IP.com Electronic Publication Date: Apr. 30, 2020, 6 pages.

Henry, et al., "Isotropic plasma etching of Ge Si and SiNx films", U.S. Department of Energy Office of Scientific and Technical Information, 17 pages, <https://doi.org/10.1116/1.4961944. https://www.osti.gov/servlets/purl/1323884>.

Oehrlein, et al., "Studies of the reactive ion etching of silicon-germanium alloys", Journal of Vacuum Science and Technology A: Vacuum, Surfaces, and Films, vol. 9, No. 3, Pt. 1, May/Jun. 1991, pp. 768-774. <https://doi.org/10.1116/1.577359>.

* cited by examiner

100

(Section X-X)

100

(Section Y-Y)

<u>100</u>

(Section X-X)

<u>100</u>

100

(Section X-X)

(Section X-X)

(Section X-X)

(Section Y-Y)

(Section Y-Y)

100

(Section Y-Y)

(Section Y-Y)

(Section Z-Z)

PROFILE ENGINEERING FOR DEEP TRENCHES IN A SEMICONDUCTOR DEVICE

BACKGROUND

The present invention generally relates to the field of complementary metal-oxide semiconductor field effect transistor (MOSFET) devices, and more particularly to the formation of deep trenches in non-planar semiconductor devices.

In contemporary semiconductor device fabrication processes a large number of semiconductor devices, such as field effect transistors (FETs), are fabricated on a single wafer. Non-planar device architectures, including nanosheet FETs, provide increased device density and increased performance over planar devices. In nanosheet FETs, in contrast to conventional FETs, the gate stack wraps around the full perimeter of each channel nanosheet, enabling fuller depletion in the channel region, and reducing short-channel effects. The wrap-around gate structure used in nanosheet devices can also enable greater management of leakage current in the active regions, even as drive current increases.

The gate structure may be formed using a gate-first or a gate-last fabrication process. A gate-last process, such as a replacement metal gate (RMG) process, utilizes a sacrificial or dummy gate, which is typically replaced by a functional gate structure.

Prior to removing the sacrificial gate and forming the functional gate structure, a gate cut module may be used to sever the sacrificial gate layer and form an opening within selected regions of the device architecture in order to isolate adjacent devices. In association with such a process, the sacrificial gate layer material removed from the openings is replaced with another dielectric material. However, in advanced nodes, the proximity of the backfilled layer to an adjacent fin may result in insufficient space for deposition of a complete functional gate structure (e.g., gate dielectric and gate conductor layers).

SUMMARY

According to an embodiment of the present disclosure, a semiconductor structure includes a gate cut isolation region composed of a top portion and a bottom portion, the top portion of the gate cut isolation region being at a first taper angle and the second portion of the gate cut isolation region being at a second taper angle, the first taper angle of the top portion being different from the second taper angle of the bottom portion. A change from the first taper angle to the second taper angle occurring at an intersection between the top portion of the gate cut isolation region and the bottom portion of the gate cut isolation region.

In an embodiment, the semiconductor structure further includes a plurality of semiconductor channel layers adjacent to the gate cut isolation region, the plurality of semiconductor channel layers being surrounded by a metal gate stack, where the intersection between the top portion of the gate cut isolation region and the bottom portion of the gate cut isolation region is coplanar with a top surface of an uppermost semiconductor channel layer.

According to another embodiment of the present disclosure, a method of forming a semiconductor structure includes forming a gate cut isolation region composed of a top portion and a bottom portion, the top portion of the gate cut isolation region begin at a first taper angle and the second portion of the gate cut isolation region being at a second taper angle, the first taper angle of the top portion being different from the second taper angle of the bottom portion. A change from the first taper angle to the second taper angle occurring at an intersection between the top portion of the gate cut isolation region and the bottom portion of the gate cut isolation region.

In an embodiment, forming the gate cut isolation region further includes forming a plurality of nanosheet fins extending from a semiconductor substrate, each of the plurality of nanosheet fins being separated by a shallow trench isolation region, forming a first dummy gate material surrounding each of the plurality of nanosheet fins, a top surface of the first dummy gate material being coplanar with a top surface of each of the plurality of nanosheet fins, and forming a second dummy gate material above the first dummy gate material and the top surface of the plurality of nanosheet fins. An etch rate of the first dummy gate material is higher than an etch rate of the second dummy gate material.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
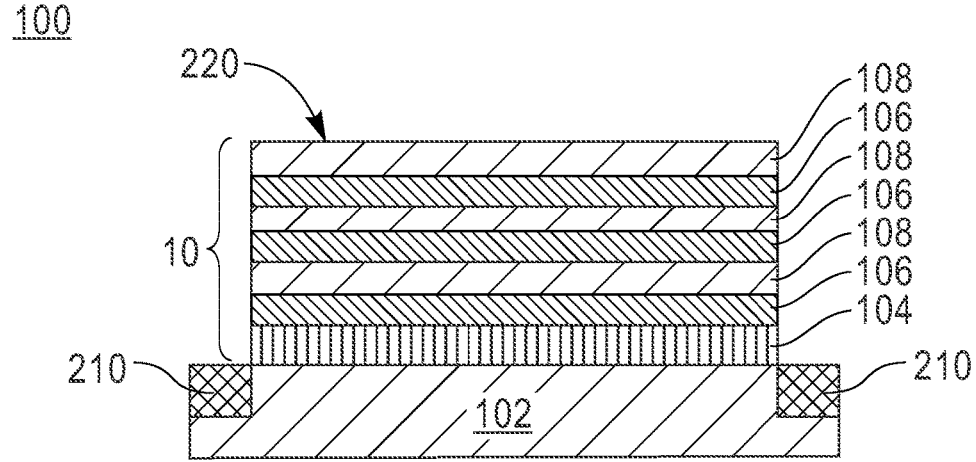
FIG. 1A is a cross-sectional view of a semiconductor structure taken along line X-X depicting a nanosheet stack formed over a semiconductor substrate, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

As integrated circuit fabrication continues to strive to produce smaller and denser integrated circuits, a viable alternative for 5 nm node technology and beyond includes nanosheet FETs. As previously described, the gate stack in nanosheet FETs wraps around the full perimeter of each nanosheet, enabling fuller depletion in the channel region, and reducing short-channel effects, among other benefits. This allows an increased device density and an increased performance over planar devices.

Nanosheet FETs often include thin alternating layers (nanosheets) of different semiconductor materials arranged in a stack. Typically, nanosheets are patterned into nanosheet fins. Once the nanosheet fins are patterned, a gate stack is formed over a channel region of the nanosheet fins, and source/drain regions are formed adjacent to the gate stack. In some devices, once the gate stack or the source/drain regions have been formed, an etching process is performed to selectively remove nanosheet layers of one of the dissimilar materials from the fins. The etching process results in the undercutting and suspension of the layers of the nanosheet fin to form nanosheets or nanowires that can be used to form gate-all-around devices.

As mentioned above, the gate structure may be formed using a gate-first or a gate-last fabrication process. A gate-last process, such as a replacement metal gate (RMG) process, utilizes a sacrificial or dummy gate, which is typically replaced by a functional gate structure.

Prior to removing the sacrificial gate and forming the functional gate structure, a gate cut module may be used to sever the sacrificial gate layer and form an opening within selected regions of the device architecture in order to isolate adjacent devices. In association with such a process, the sacrificial gate layer material removed from the openings is replaced with another dielectric material to form a gate cut structure or gate cut isolation region. However, in advanced nodes, the proximity of the backfilled layer to an adjacent (nanosheet) fin may result in insufficient space for deposition of a complete functional gate structure (e.g., gate dielectric and gate conductor layers).

More particularly, in aggressively scaled devices, it is difficult to create a gate cut opening between nanosheet fins due to the small space therebetween. In some instances, the critical dimension (CD) of the gate cut recess and subsequent gate cut isolation region may be such that it is difficult to form work function materials (WFM) and metal conductive fill materials without forming voids adjacent the gate cut isolation region.

Therefore, embodiments of the present disclosure provide a method for conducting a gate cut process, and the resulting device, in which a profile discontinuity is created in the gate cut isolation region adjacent to nanosheet fins. This discontinuity in the gate cut isolation region profile includes a taper angle that creates more space between the nanosheet fins and the gate cut isolation region, which in turn allows better coverage of the work function metals onto the nanosheet fins. Embodiments by which the tapered gate cut isolation region can be formed are described in detailed below by referring to the accompanying drawings in FIGS. 1A-5D.

Figure 1B:
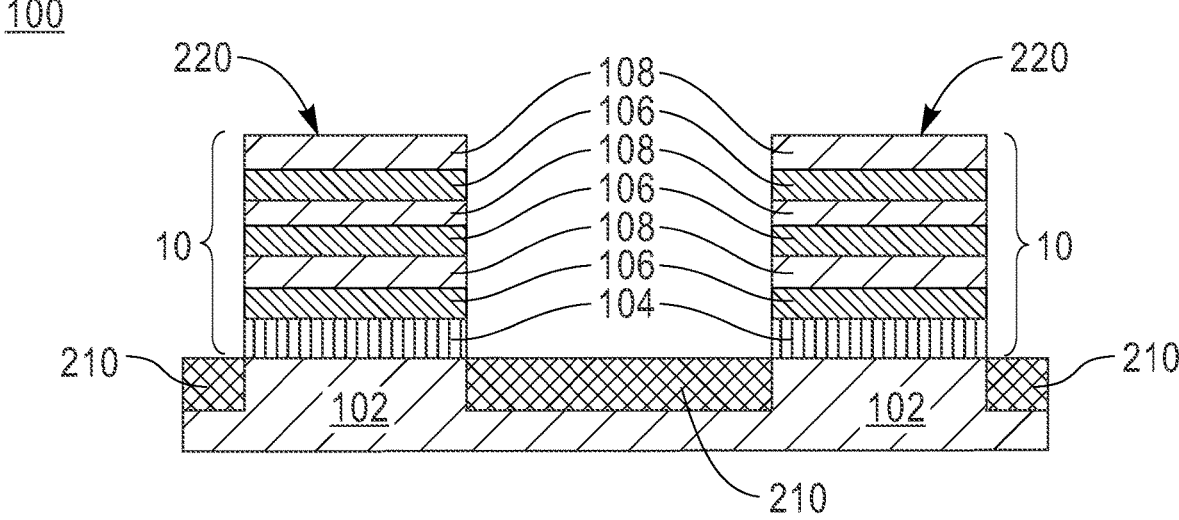
FIG. 1B is a cross-sectional view of the semiconductor structure taken along line Y-Y.
Figure 1C:
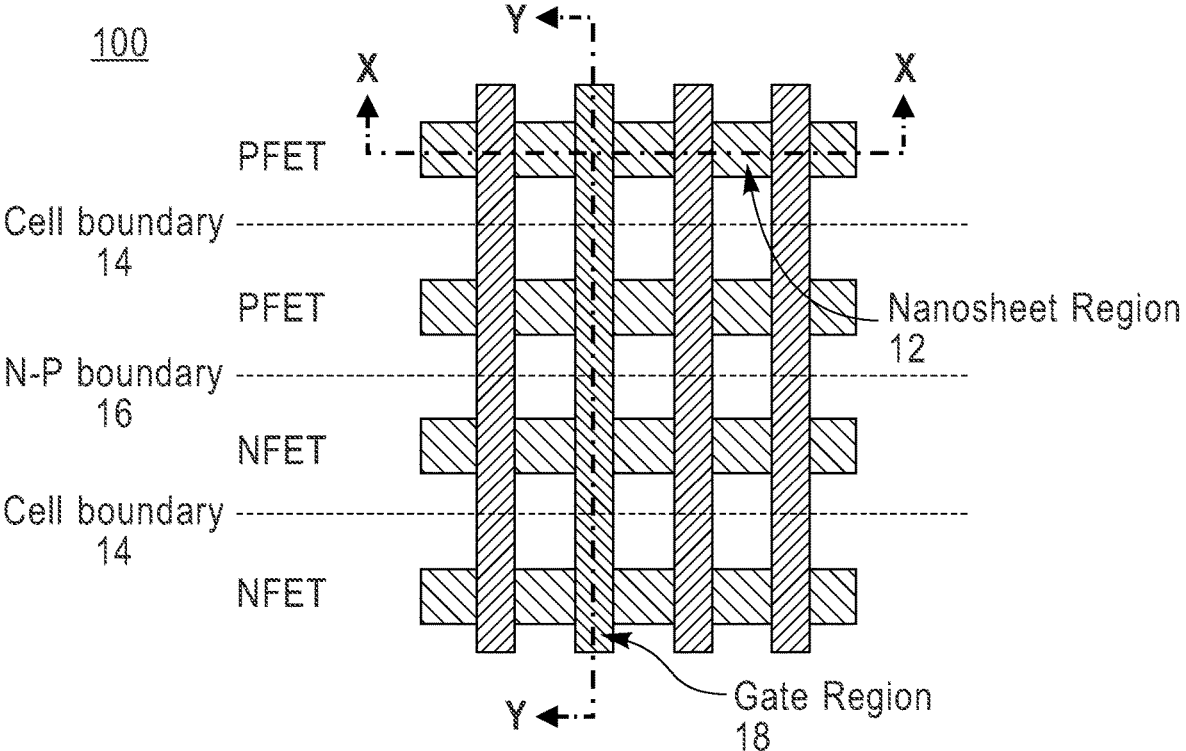
FIG. 1C is a top-down view of the semiconductor structure.

Referring now to FIG. 1A, a cross-sectional view of a semiconductor structure 100 including a nanosheet stack 10 formed over a semiconductor substrate 102 is shown, according to an embodiment of the present disclosure. In this embodiment, FIG. 1A is a cross-sectional view of the semiconductor structure 100 taken along line X-X as depicted in FIG. 1C; FIG. 1B is a cross-sectional view of the semiconductor structure 100 taken along line Y-Y as depicted in FIG. 1C; and FIG. 1C is a top-down view of the semiconductor structure 100.

It should be noted that FIG. 1C depicts different regions of the semiconductor structure 100 across and/or along which cross-sectional views of the semiconductor structure 100 will be taken to describe embodiments of the present disclosure. In this embodiment, the cross-sectional views are taken along line X-X and line Y-Y. As depicted in FIG. 1C, line X-X represents a cut across a nanosheet fin region 12 of the semiconductor structure 100, while line Y-Y represents a cut along a gate region 18 of the semiconductor structure 100. In this embodiment, the cross-sectional view taken along line Y-Y, as depicted in FIG. 1C, may further include a view of PFET regions, NFET regions, an area (N-P boundary) 16 between a PFET region and an NFET region, and a cell boundary located between contiguous PFET or NFET regions. As may be known by those skilled in the art, the nanosheet fin region 12 represents a region of the semiconductor structure 100 in which nanosheet fin structures are formed. Similarly, the gate region 18 represents a region of the semiconductor structure 100 in which a gate structure is formed.

According to an embodiment, an alternating sequence of layers of sacrificial semiconductor material and layers of semiconductor channel material vertically stacked one on top of another in a direction perpendicular to the semiconductor substrate 102 forms the nanosheet stack 10, as illustrated in FIGS. 1A-1B. Specifically, the alternating sequence includes a nanosheet stack sacrificial layer 104 above the semiconductor substrate 102, a sacrificial semiconductor layer 106 above the nanosheet stack sacrificial layer 104, and a semiconductor channel layer 108. In the example depicted in FIGS. 1A-1B, alternating sacrificial semiconductor layers 106 and semiconductor channel layers 108 are formed in a stack above the nanosheet stack sacrificial layer 104 on the semiconductor substrate 102. The term sacrificial, as used herein, means a layer or other structure, that is (or a part thereof is) removed before completion of the final device. For instance, in the example being described, portions of the sacrificial semiconductor layers 106 will be removed from the stack in the channel region of the device to permit the semiconductor channel layers 108 to be released from the nanosheet stack 10. It is notable that while in the present example the sacrificial semiconductor layers 106 and the semiconductor channel layers 108 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

The semiconductor substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the semiconductor substrate 102 may be approximately, but is not limited to, several hundred microns thick. In other embodiments, the semiconductor substrate 102 may be a layered semiconductor such as a silicon-on-insulator or SiGe-on-insulator, where a buried insulator layer, separates a base substrate from a top semiconductor layer.

With continued reference to FIGS. 1A-1C, a first layer in the stack (a sacrificial layer), i.e., the nanosheet stack sacrificial layer 104, is formed on the semiconductor substrate 102. According to an exemplary embodiment, the nanosheet stack sacrificial layer 104 in the nanosheet stack 10 is formed using an epitaxial growth process. For instance, in the described embodiment, the nanosheet stack sacrificial layer 104 is formed by epitaxially growing a layer of SiGe with a germanium concentration varying between approximately 50 atomic percent to approximately 70 atomic percent, and ranges therebetween. The higher concentration of germanium atoms allows the nanosheet stack sacrificial layer 104 to be subsequently removed selective to the remaining alternating layers of the nanosheet stack 10, as will be described in detail below. By way of example only, the nanosheet stack sacrificial layer 104 may be formed having a thickness varying from approximately 20 nm to approximately 35 nm, although thicknesses greater than 20 nm and less than 35 nm may also be used.

In general, layers in the nanosheet stack 10 (e.g., SiGe/Si layers) can be formed by epitaxial growth by using the semiconductor substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the alternating sequence of SiGe/Si layers in the nanosheet stack 10. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

With continued reference to FIGS. 1A-1B, similar to the nanosheet stack sacrificial layer 104, the sacrificial semiconductor layers 106 are formed by epitaxially growing a layer of SiGe. However, the germanium concentration of the sacrificial semiconductor layers 106 varies from approximately 20 atomic percent to approximately 40 atomic percent. In an exemplary embodiment, the sacrificial semiconductor layers 106 are made of SiGe with a germanium concentration of approximately 25 atomic percent.

To continue building the nanosheet stack 10, the semiconductor channel layers 108 are formed by epitaxially growing a Si layer. As depicted in the figure, the sacrificial semiconductor layers 106 and the semiconductor channel layers 108 in the nanosheet stack 10 are thinner than the underlying nanosheet stack sacrificial layer 104 and have a substantially similar or identical thickness. As shown in FIGS. 1A-1B, the nanosheet stack 10 is grown by forming (SiGe) sacrificial semiconductor layers 106 and (Si) semiconductor channel layers 108 in an alternating manner onto the nanosheet stack sacrificial layer 104. Accordingly, each of the sacrificial semiconductor layers 106 and the semiconductor channel layers 108 in the nanosheet stack 10 can be formed in the same manner as described above, e.g., using an epitaxial growth process, to a thickness varying from approximately 6 nm to approximately 12 nm, although other thicknesses are within the contemplated scope of the invention.

Thus, each of the layers in the nanosheet stack 10 have nanoscale dimensions, and thus can also be referred to as nanosheets. Further, as highlighted above, the (Si) semiconductor channel layers 108 in the nanosheet stack 10 will be used to form the channel layers of the device. Consequently, the dimensions of the semiconductor channel layers 108 dictate the dimensions of the channel region of the semiconductor structure 100.

As highlighted above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack 10 can contain more or fewer layers than are shown in the figures.

The nanosheet stack 10 can be used to produce a gate all around device that includes vertically stacked semiconductor channel material nanosheets for a positive channel Field Effect Transistor (hereinafter "PFET") or a negative channel Field Effect Transistor (hereinafter "NFET") device.

With continued reference to FIGS. 1A-1B, a plurality of nanosheet fins (hereinafter "nanosheet fins") 220 may be formed from the nanosheet stack 10 (FIG. 1), according to an embodiment of the present disclosure. For illustration purposes only, reference is made to operations performed on and to a semiconductor structure 100 having a certain number of nanosheet fins. It is understood, however, that the semiconductor structure 100 can include any number of nanosheet fins 220 needed to satisfy design requirements.

The nanosheet fins 220 can be formed by, for example, a photolithographic patterning and etching process that removes portions of the nanosheet stack 10 and portions of the semiconductor substrate 102. Any suitable etching process can be used such as, for example, reactive ion etching (RIE).

It should be noted that portions of the semiconductor substrate 102 removed during the photolithographic patterning process are subsequently filled with an insulating material to form shallow trench isolation (STI) regions 210. The process of forming the STI regions 210 is standard and well-known in the art, it typically involves depositing the insulating material to substantially fill areas of the semiconductor structure 100 between adjacent nanosheet fins 220 (as depicted in FIG. 1B) for electrically isolating the nanosheet fins 220. The STI regions 210 may be formed by, for example, chemical vapor deposition (CVD) of a dielectric material. Non-limiting examples of dielectric materials to form the STI regions 210 include silicon oxide, silicon nitride, hydrogenated silicon carbon oxide, silicon based low-k dielectrics, flowable oxides, porous dielectrics, or organic dielectrics including porous organic dielectrics.

Figure 2A:
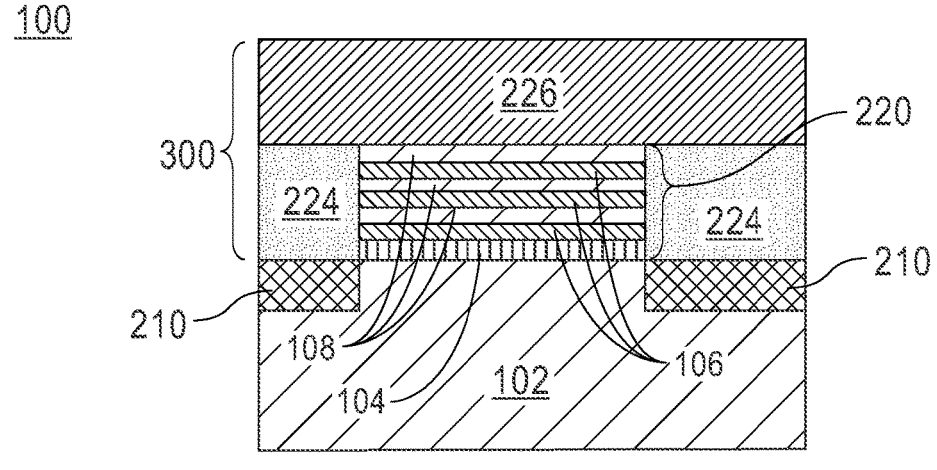
FIG. 2A is a cross-sectional view of the semiconductor structure taken along line X-X after forming a first dummy gate material and a second dummy gate material, according to an embodiment of the present disclosure.
Figure 2B:
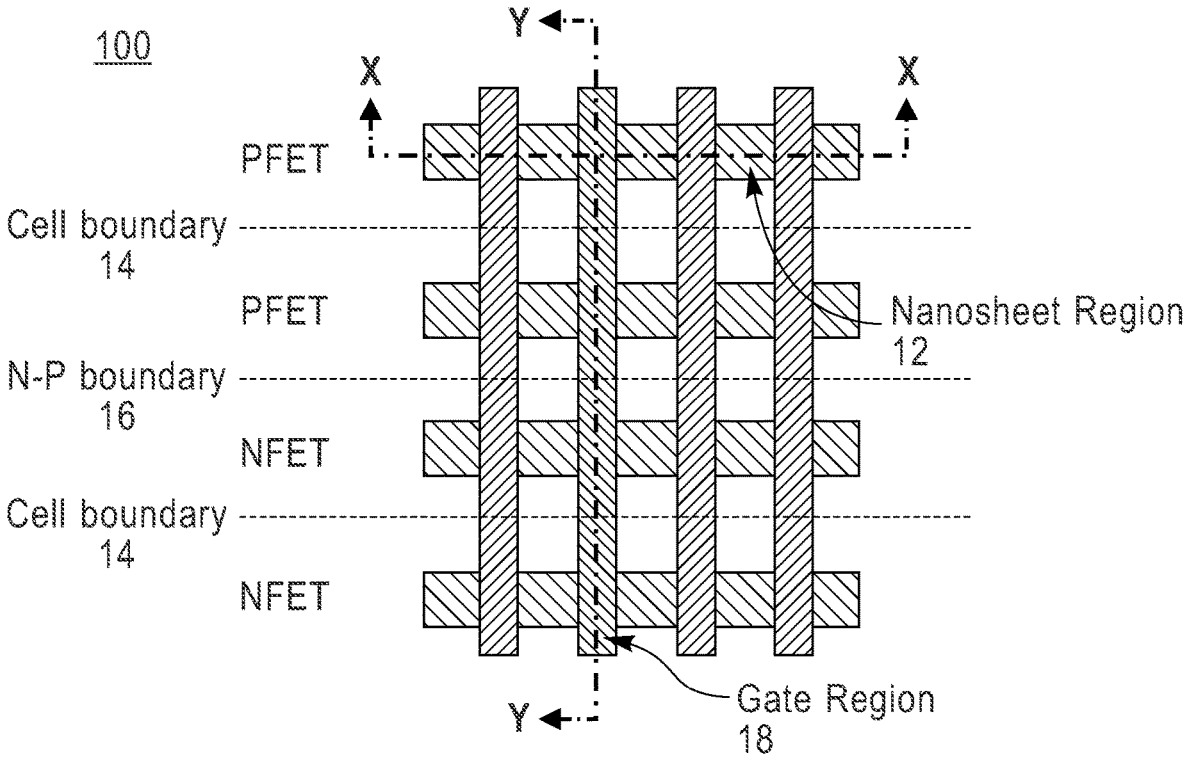
FIG. 2B is a top-down view of the semiconductor structure.

Referring now to FIG. 2A, a cross-sectional view of the semiconductor structure 100 depicting the formation of a first dummy gate material 224 and a second dummy gate material 226 is shown, according to an embodiment of the present disclosure. In this embodiment, FIG. 2A is a cross-sectional view of the semiconductor structure 100 taken along line X-X as depicted in FIG. 2B; and FIG. 2B is a top-down view of the semiconductor structure 100 depicting different regions across and/or along which cross-sectional views of the semiconductor structure 100 will be taken to describe the present embodiment.

The first dummy gate material 224 and the second dummy gate material 226 form a dummy or sacrificial gate structure 300 for the semiconductor structure 100. In an embodiment, the first dummy gate material 224 is formed along sidewalls of the nanosheet fin 220 and includes a material with a higher etch rate than the second dummy gate material 226. In one embodiment, for example, the first dummy gate material 224 may include a layer of SiGe with a germanium concentration varying between approximately 80 atomic percent to approximately 90 atomic percent, and ranges therebetween. In another embodiment, the first dummy gate material 224 may include a layer of germanium (Ge). The first dummy gate material 224 can be formed using any suitable deposition method including, for example, chemical vapor deposition (CVD) or atomic layer deposition (ALD). According to an embodiment, the first dummy gate material 224 is formed in a way such that a top surface of the first dummy gate material 224 and a top surface of the nanosheet fin(s) 220 are substantially coplanar or flush.

The second dummy gate material 226 is formed above and in contact with top surfaces of the first dummy gate material 226 and nanosheet fin 220. The second dummy gate material 226 can be formed using conventional techniques known in the art. For example, the second dummy gate material 226 may be formed from amorphous silicon (a-Si). A thickness of the second dummy gate material 226 may vary from approximately 20 nm to approximately 200 nm, and ranges therebetween. It should be noted that an etch rate ratio between the first dummy gate material 224 and the second dummy gate material 226 can be adjusted by controlling the RIE chemistry. In one or more embodiments, the second dummy gate material 226 can be planarized using a process such as chemical mechanical polishing (CMP).

Figure 3A:
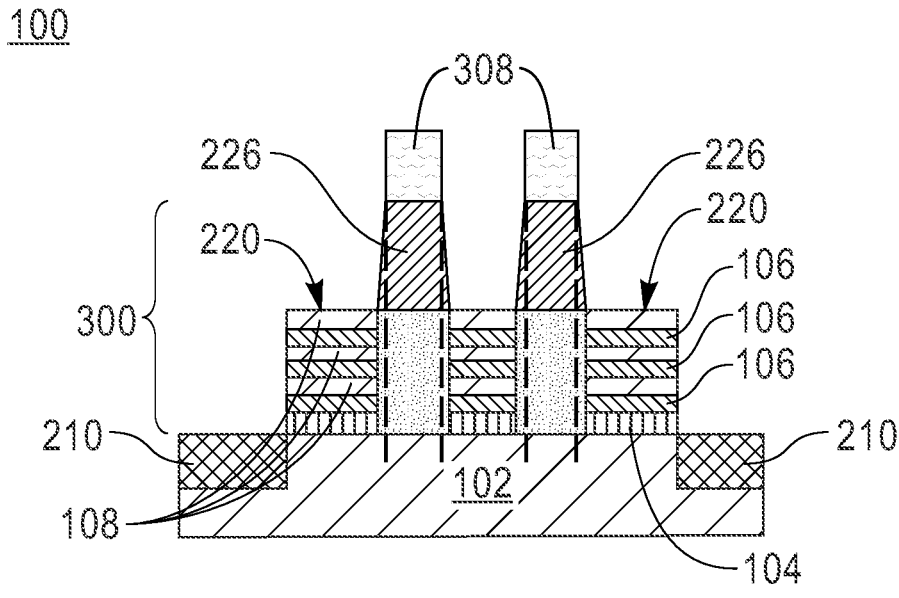
FIG. 3A is a cross-sectional view of the semiconductor structure taken along line X-X after patterning the second dummy gate material, according to an embodiment of the present disclosure.
Figure 3B:
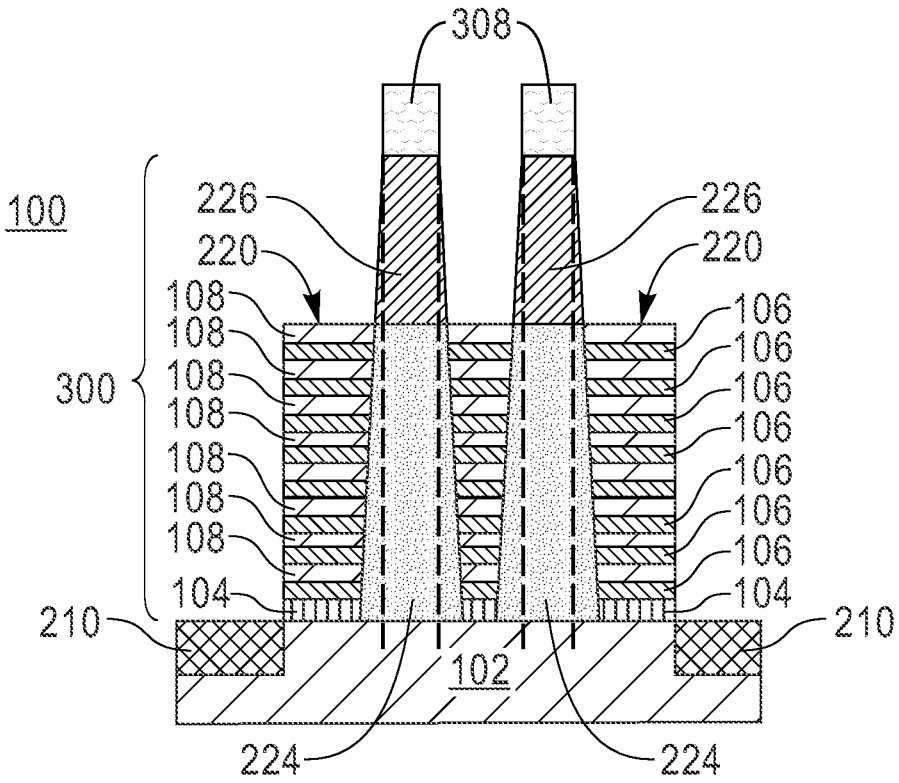
FIG. 3B is a cross-sectional view of the semiconductor structure taken along line X-X depicting an alternate embodiment.
Figure 3C:
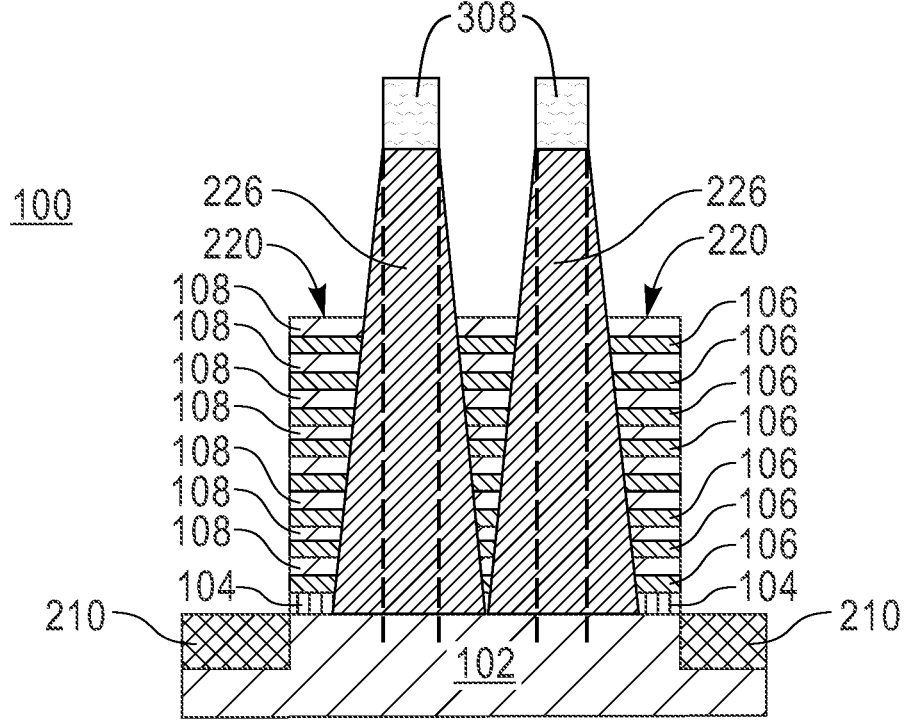
FIG. 3C is a cross-sectional view of an exemplary semiconductor structure taken along line X-X depicting an alternate embodiment.
Figure 3D:
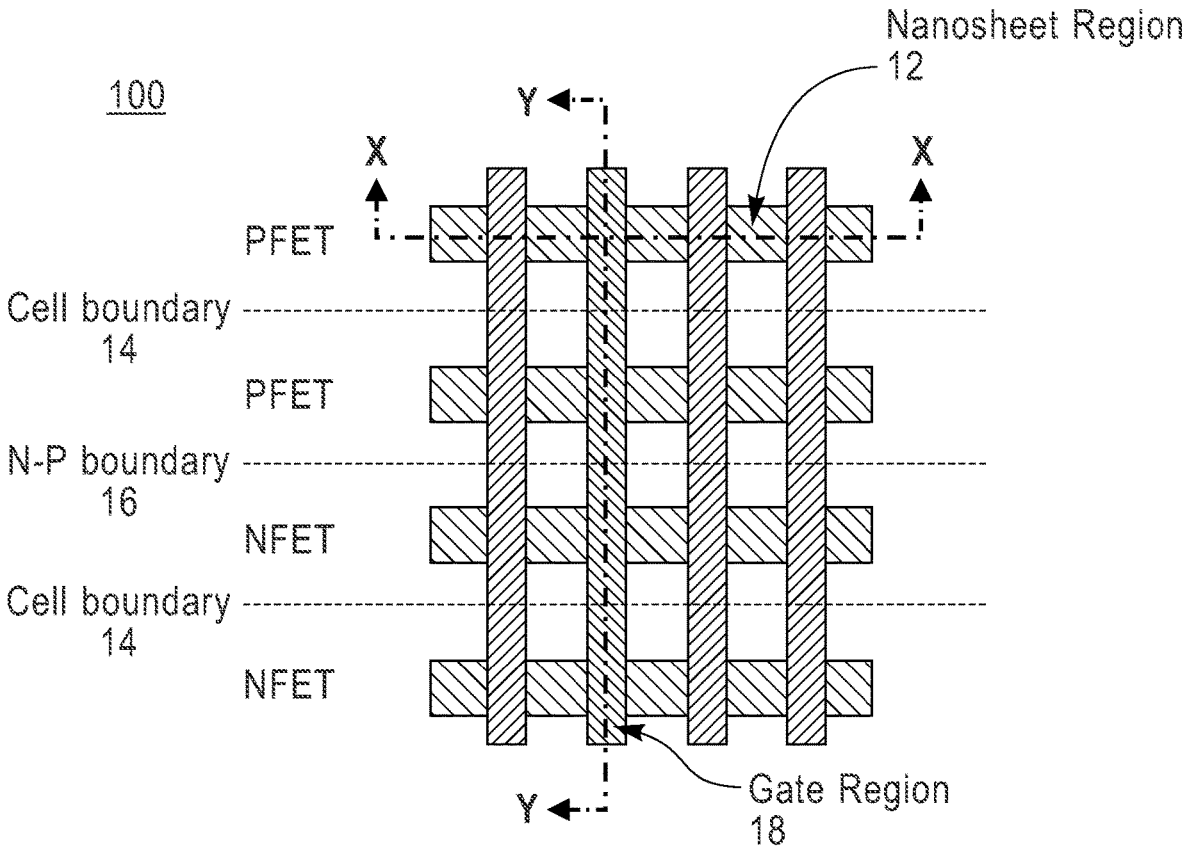
FIG. 3D is a top-down view of the semiconductor structure.

Referring now to FIG. 3A, a cross-sectional view of the semiconductor structure 100 is shown after patterning the second dummy gate material 226, according to an embodiment of the present disclosure. In this embodiment, FIG. 3A is a cross-sectional view of the semiconductor structure 100 taken along line X-X as depicted in FIG. 3D; FIG. 3B depicts an alternate embodiment; FIG. 3C depicts an exemplary semiconductor structure 100 in which the dummy gate structure is formed using conventional methods, according to an alternate embodiment; and FIG. 3D is a top-down view of the semiconductor structure 100 depicting different regions across and/or along which cross-sectional views of the semiconductor structure 100 will be taken to describe the present embodiment.

In this embodiment, a hardmask 308 is deposited onto the planarized second dummy gate material 226 to be used as an etch mask layer. Suitable hardmask materials to form the hardmask 308 include, but are not limited to, silicon nitride (SiN), silicon dioxide ($SiO_2$), and amorphous Si (a-Si).

As shown in FIG. 3A, the second dummy gate material 226 is then patterned using standard lithography and etching techniques. As depicted in FIG. 3A, sidewalls of the bottom first dummy gate material 224 may be closer to being vertical (i.e., perpendicular to the semiconductor substrate 102) than the top second dummy gate material 226. Stated differently, the bottom portion of the dummy gate structure 300 formed by the second dummy gate material 226 maintains a substantially constant width from top to bottom. As may be understood, taperness can be defined as the difference between a bottom critical dimension (CD) and a top CD. i.e., taperness=bottom CD-top CD. Thus, it is desirable that this difference can be as close to zero as possible. Accordingly, forming the dummy gate structure 300 using the first dummy gate material 224 and the second dummy gate material 226 provides better taperness (i.e., closer to zero) in the lower portion of the dummy gate structure 300, unlike traditional dummy gate structures formed using a single layer of sacrificial material (e.g., a-Si).

FIG. 3B depicts an alternate embodiment in which the semiconductor structure 100 includes a high aspect ratio dummy gate structure 300 (e.g., the semiconductor structure 100 includes a stacked FET), even in this case, the sidewalls of the bottom first dummy gate material 224 showed less widening towards the bottom (i.e., less deviation from the vertical plane depicted by dashed lines) than a typical dummy gate structure composed of substantially the same material (i.e., a-Si) shown in FIG. 3C. Thus, by forming a dummy gate structure 300 including the (bottom) first dummy gate material 224 and the (top) second dummy gate material 226 having different etch rates, trimming of a bottom profile of the dummy gate structure 300 may be easier and accurate, as will be described in detail below. This in turn can mitigate typical problems accompanying bottom trimming such as, for example, fin erosion and gate (PC) top shrink.

Figure 4A:
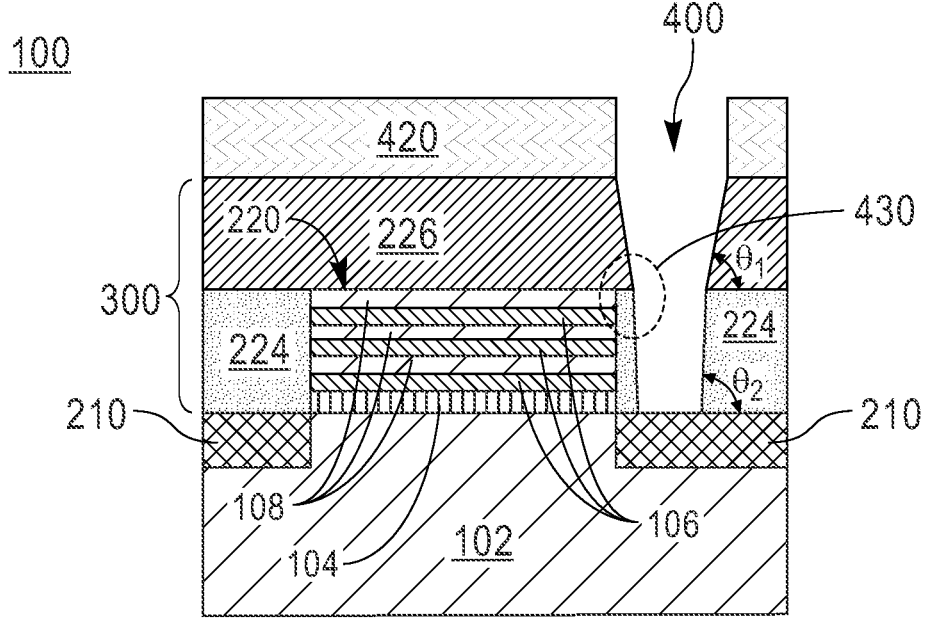
FIG. 4A is a cross-sectional view of the semiconductor structure taken along line Y-Y after conducting a gate cut process, according to an embodiment of the present disclosure.
Figure 4B:
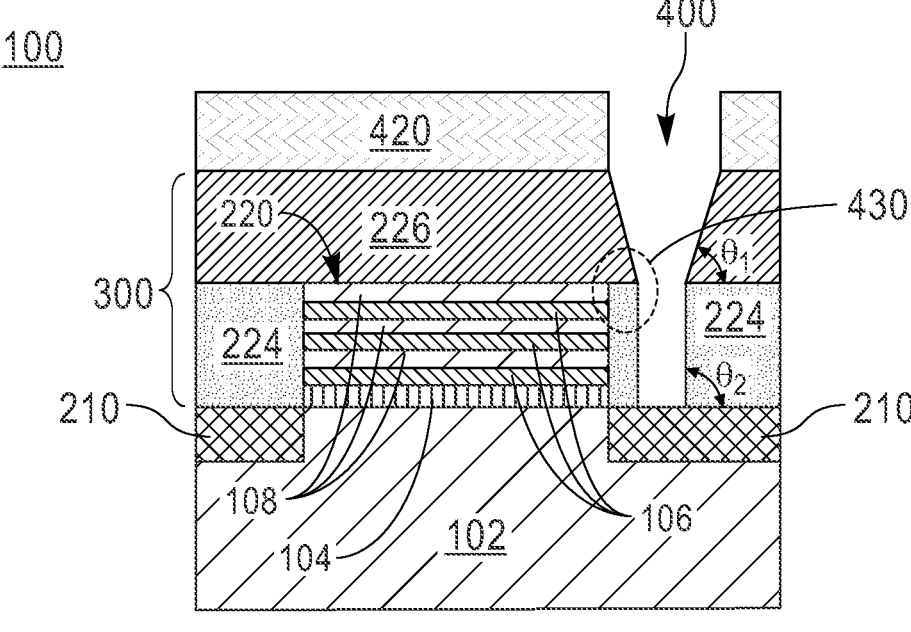
FIG. 4B is a cross-sectional view of the semiconductor structure taken along line Y-Y depicting an alternate embodiment.
Figure 4C:
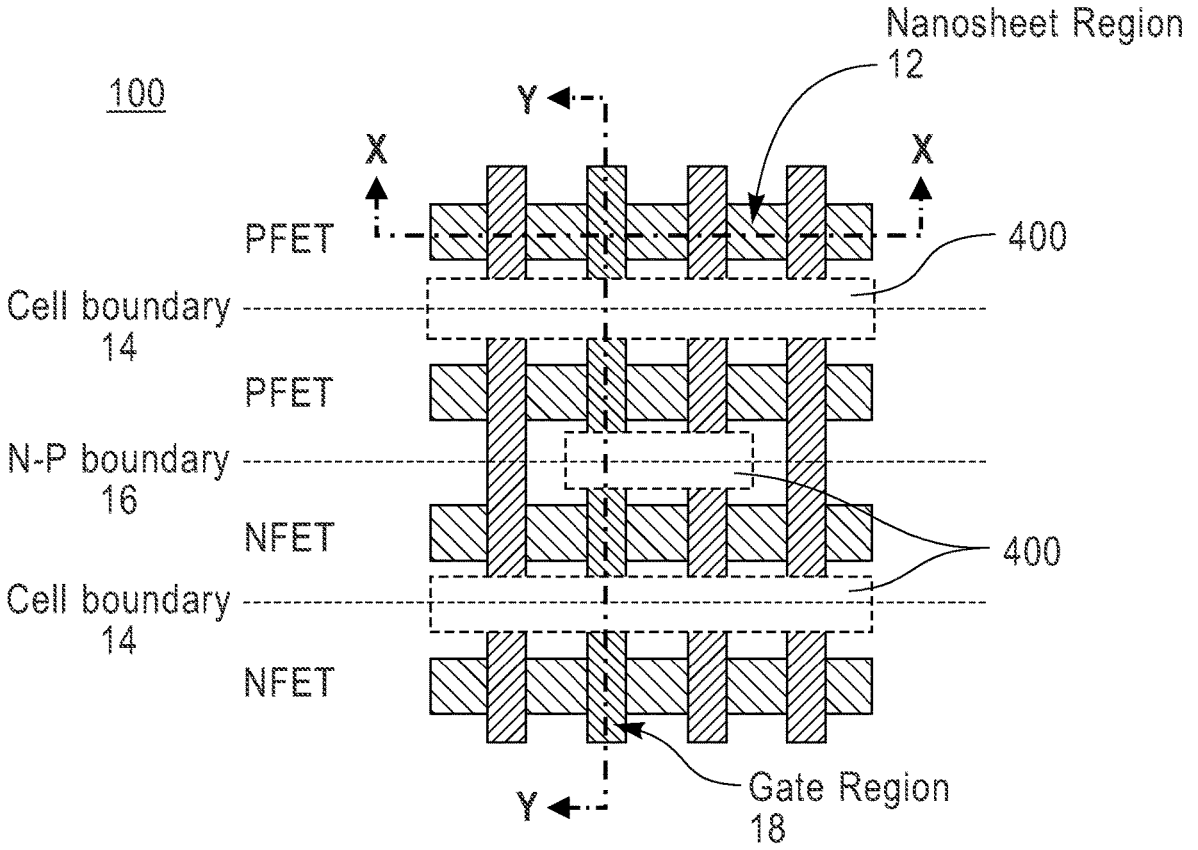
FIG. 4C is a top-down view of the semiconductor structure.

Referring now to FIG. 4A, a cross-sectional view of the semiconductor structure 100 is shown after conducting a gate cut process also known as CT cut, according to an embodiment of the present disclosure. In this embodiment, FIG. 4A is a cross-sectional view of the semiconductor structure 100 taken along line Y-Y as depicted in FIG. 4C; FIG. 4B depicts an alternate embodiment; and FIG. 4C is a top-down view of the semiconductor structure 100 depicting different regions across and/or along which cross-sectional views of the semiconductor structure 100 will be taken to describe the present embodiment. FIG. 4C further depicts gate cut isolation trenches 400.

It should be noted that known semiconductor fabrication operations have been used to form the semiconductor structure 100 as depicted in FIGS. 4A-4C. Thus, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Particularly, at this step of the manufacturing process, a plurality of source/drain (S/D) regions (not shown) may be formed adjacent to the nanosheet fins 220 such that the nanosheet fins 220 extend between portions of an adjacent S/D region (not shown). S/D regions are omitted from the different views for clarity of the orientation of the dummy gate structure 300 and nanosheet fins 220 in the various cross-sections. In one embodiment, nanosheet fins 200 extend between adjacent S/D regions and do not extend through S/D regions (not shown). In one embodiment, S/D regions may be epitaxially grown. Additionally, in one or more embodiments, prior to forming the S/D regions, the nanosheet stack sacrificial layer 104 can be selective removed and replaced with a bottom dielectric isolation region 502 (shown in FIGS. 5A-5B).

A gate hardmask 420 may be formed over the second dummy gate material 226 of the dummy gate structure 300 using known deposition techniques. For example, in one embodiment, the gate hardmask 420 may include a material such as silicon nitride (SiN), deposited on the second dummy gate material 226. In some embodiments, offset spacers (not shown) may be formed by selectively removing portions of the sacrificial semiconductor layers 106 and depositing SiN to replace the removed portions of the sacrificial semiconductor layers 106. It should be understood that the gate hardmask 420 and the offset spacers (not shown) may include different materials. In one embodiment, after the offset spacers (not shown) are formed, source/drain regions (not shown) may be epitaxially grown from sidewalls of the nanosheet fins 220.

With continued reference to FIGS. 4A-4C, a portion of the dummy gate structure 300 formed by the first dummy gate material 224 and the second dummy gate material 226 may be removed at a location between nanosheet fins 220 corresponding to the gate cut isolation trenches 400 depicted in FIG. 4C. In one embodiment, portions of the first dummy gate material 224 and the second dummy gate material 226 are cut by etching through the gate hardmask 420, the first dummy gate material 224 and the second dummy gate material 226 selective to the semiconductor substrate 102 and STI regions 210. In one embodiment, cutting the dummy gate structure 300 includes applying a mask (not shown) to the gate hardmask 420 and removing material from the dummy gate structure 300 using a plasma etch, reactive ion etch, or other anisotropic etch process to form the gate cut isolation trenches 400.

It should be noted that due to the etch rate difference between the first dummy gate material 224 and the second dummy gate material 226, there is a profile discontinuity at an interface 430 between the first dummy gate material 224 and the second dummy gate material 226 (circled regions in FIGS. 4A-4B) after the CT cut. This profile discontinuity caused by the etch rate difference allows the (top) second dummy gate material 226 to have a larger taper angle, which provides more space around the nanosheet fin(s) 220 thereby improving metal gate coverage over the nanosheet fin(s) 220. FIG. 4B depicts an alternate embodiment in which the etch rate difference between the first dummy gate material 224 and the second dummy gate material 226 has been adjusted (i.e., etch rate of the first dummy gate material 224 is substantially higher than the second dummy gate material 226) to obtain a more pronounced or noticeable tapered profile in the (top) second dummy gate material 226 which may further improve metal gate coverage over the nanosheet fin(s) 220.

More specifically, sidewalls of the second dummy gate material 226 and sidewalls of the first dummy gate material 224 exposed by the gate cut isolation trenches 400 include a first slope angle θ1 and a second slope angle θ2, respectively, measured from a horizontal plane (i.e., parallel to the semiconductor substrate 102). The first slope angle θ, and second slope angle θ2 are different, with the second slope angle θ2 being larger than the first slope angle θ, and closer to 90 degrees (i.e., perpendicular to the semiconductor substrate 102). In one embodiment, the first slope angle θ1 varies approximately between 75-85 degrees, while the second slope angle θ2 varies approximately between 85-90 degrees. The change in slope occurs at the interface 430, which is located at substantially the same level as the top surface of the nanosheet fin 220.

Figure 5A:
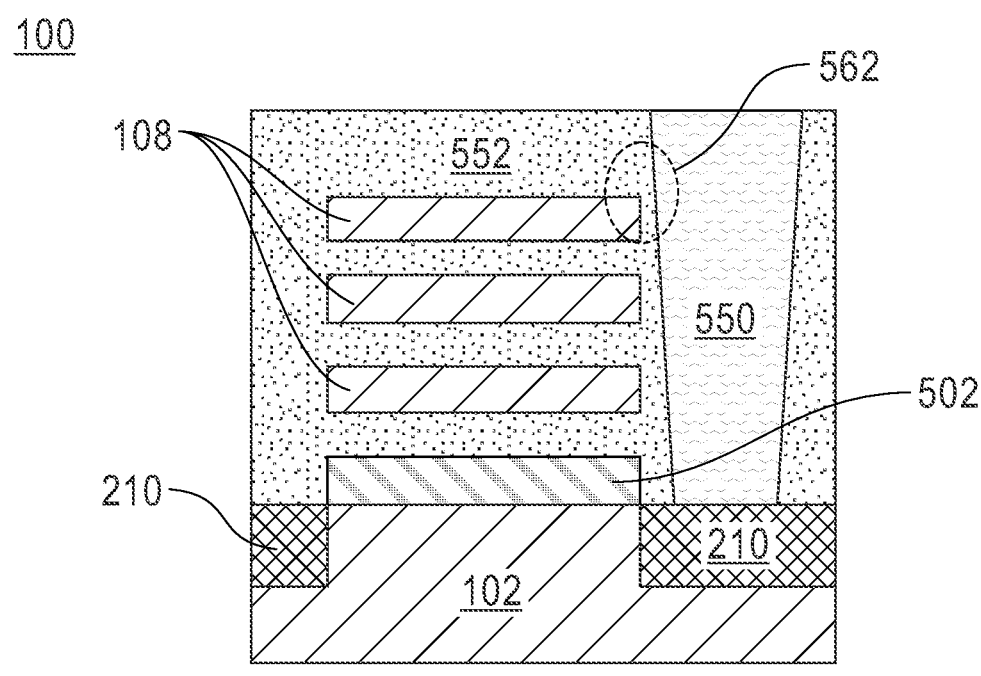
FIG. 5A is a cross-sectional view of the semiconductor structure taken along line Y-Y after conducting a replacement metal gate process, according to an embodiment of the present disclosure.
Figure 5B:
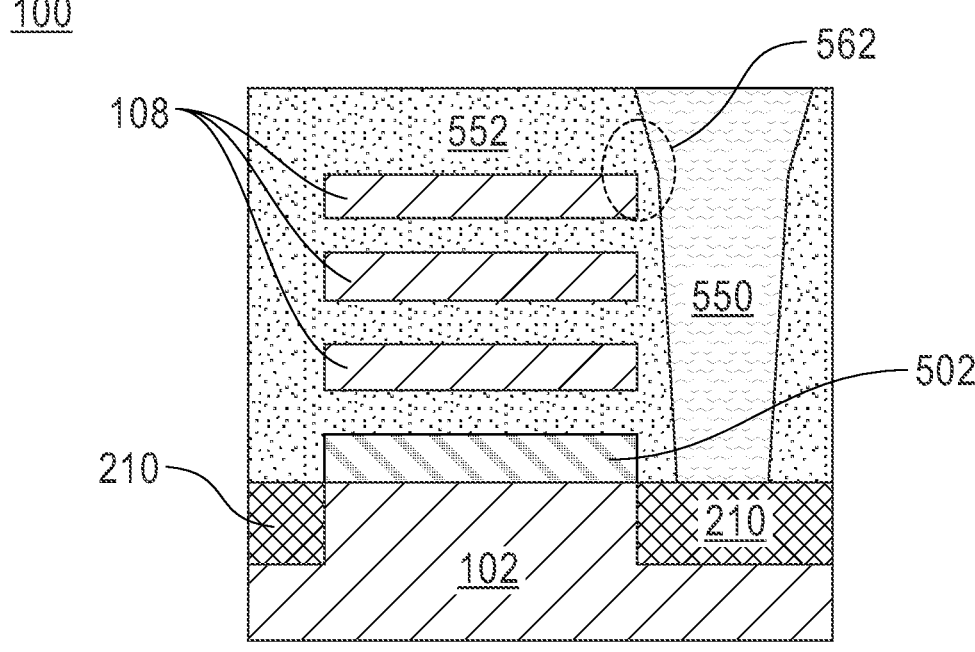
FIG. 5B is a cross-sectional view of the semiconductor structure taken along line Y-Y depicting an alternate embodiment.
Figures 5C, 5D:
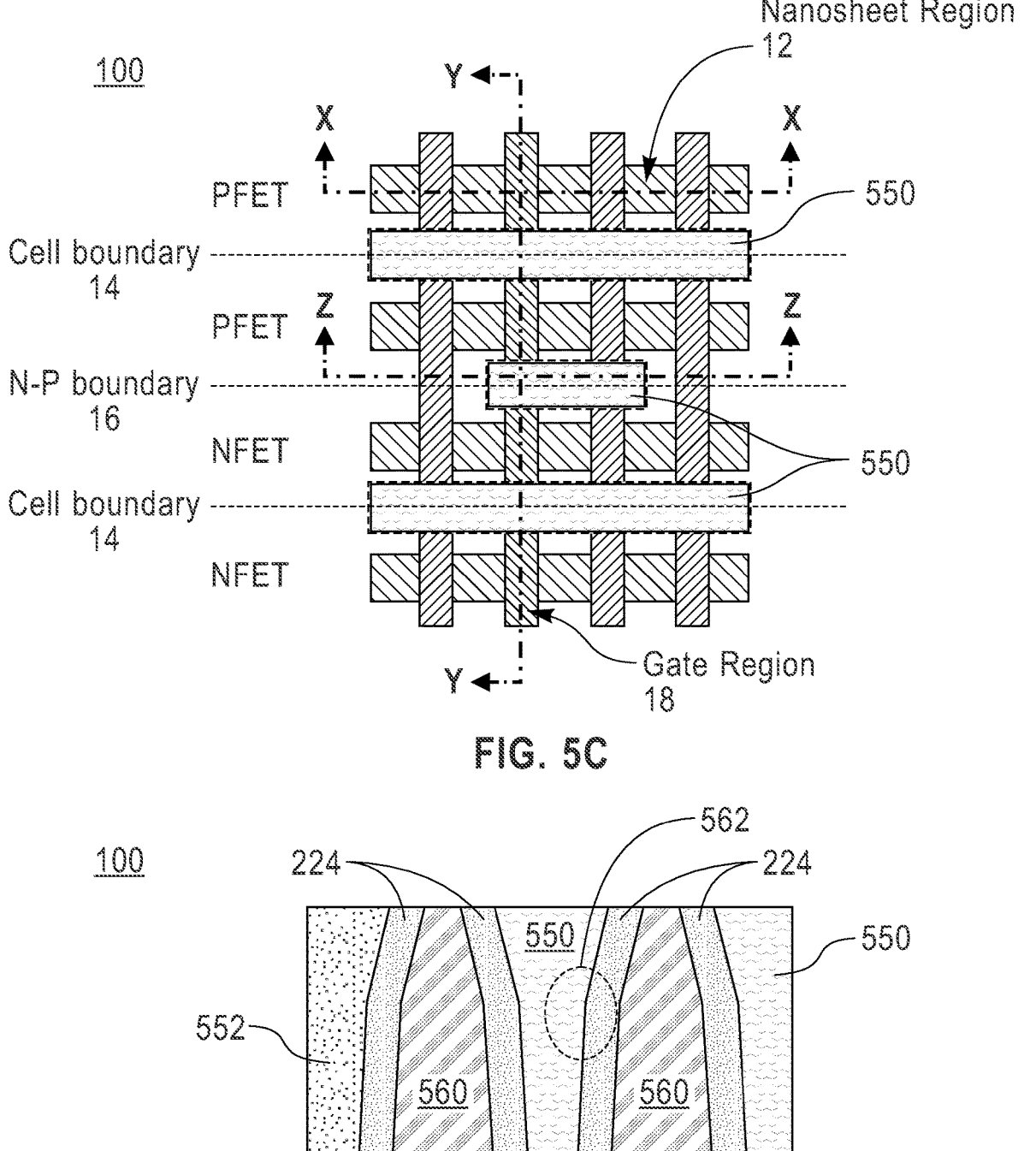
FIG. 5C is a top-down view of the semiconductor structure.
FIG. 5D is a cross-sectional view of the semiconductor structure taken along line Z-Z.

Referring now to FIG. 5A, a cross-sectional view of the semiconductor structure 100 is shown after conducting a replacement metal gate (RMG) process, according to an embodiment of the present disclosure. In this embodiment, FIG. 5A is a cross-sectional view of the semiconductor structure 100 taken along line Y-Y as depicted in FIG. 5C; FIG. 5B depicts an alternate embodiment; FIG. 5C is a top-down view of the semiconductor structure 100 depicting different regions across and/or along which cross-sectional views of the semiconductor structure 100 will be taken to describe the present embodiment; and FIG. 5D is a cross-sectional view of the semiconductor structure taken across line Z-Z as depicted in FIG. 5C. FIG. 5C further depicts gate cut isolation regions 550.

Known semiconductor fabrication operations have been used to form the semiconductor structure 100 as depicted in FIGS. 5A-5D. Thus, details of well-known features and techniques may be omitted to avoid unnecessarily obscuring the present embodiment.

In this embodiment, a dielectric material is deposited within the gate cut isolation trenches 400 (FIGS. 4A-4C) to form gate cut structures or gate cut isolation regions 550. In an exemplary embodiment, the gate cut isolation regions 550 include a nitride material deposited using standard deposition techniques. In one particular embodiment, the gate cut isolation regions 550 include silicon nitride (SiN).

The first dummy gate material 224 and the second dummy gate material 226 forming the dummy gate structure 300 (FIGS. 4A-4B) are subsequently removed from the semiconductor structure 100. The removal of the dummy gate structure 300 may include removing layers of dielectric and gate hardmask 420 above the dummy gate structure 300 (shown in FIGS. 4A and 4B) by chemical mechanical polishing (CMP). Removal of the dummy gate structure 300 may also include an isotropic etch selective to the semiconductor substrate 102, nanosheet fins 220, and gate cut isolation regions 550. In a gate-last fabrication process, the removed dummy gate structure 300 (FIGS. 4A-4B) is thereafter replaced with corresponding work function metals, as known in the art.

At this step of the manufacturing process, the sacrificial semiconductor layers 106 can now be removed from the semiconductor structure 100. In an exemplary embodiment, the sacrificial semiconductor layers 106 can be removed by known etching processes including, for example, RIE, wet etch or dry gas (HCl). Removal of the sacrificial semiconductor layers 106 create cavities (not shown) that will subsequently be filled with corresponding work function metals.

It should be noted that an interlevel dielectric (ILD) layer 560 is typically formed (after forming S/D regions and prior to the replacement metal gate process) to fill voids in the semiconductor structure 100. The ILD layer 560 can be formed by, for example, CVD of a dielectric material. Non-limiting examples of dielectric materials to form the ILD layer 560 may include silicon oxide, silicon nitride, hydrogenated silicon carbon oxide, silicon based low-k dielectrics, flowable oxides, porous dielectrics, or organic dielectrics including porous organic dielectrics.

According to an embodiment, the removed dummy gate structure 300 (FIGS. 4A-4B) is replaced with a metal gate stack 552 to complete the metal gate formation process. The metal gate stack 552 may include one or more work function metals such as, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIGS. 5A-5B, the metal gate stack 552 surrounds (stacked) semiconductor channel layers 108.

In one or more embodiments, prior to forming the metal gate stack 552, a gate dielectric stack (not shown) is deposited in the semiconductor structure 100. In such embodiments, the gate dielectric stack may include a layer of silicon oxide and a layer of a high-k dielectric material, such as a hafnium based material. The metal gate stack 552 is deposited above the gate dielectric stack (not shown).

After depositing the metal gate stack 552, a chemical mechanical polishing (CMP) may be conducted to remove excess material and polish upper surfaces of the semiconductor structure 100.

Thus, the tapered profile of a top portion of the gate cut isolation region 550 creates a profile discontinuity at an intersection 562 between the top portion of the gate cut isolation region 550 and a bottom portion of the gate cut isolation region 550, as depicted in FIGS. 5A-5B. In this embodiment, FIG. 5A corresponds to the embodiment illustrated in FIG. 4A, while FIG. 5B corresponds to the alternate embodiment (i.e., narrower taper angle towards the STI region 210). Such profile discontinuity at the intersection 562 allows the metal gate stack 552 to cover a larger area between the gate cut isolation region 550 and semiconductor channel layer(s) 108 for improved device performance and reliability. In one or more embodiments, the taper profile can be expressed in terms of a difference in width at the opposites ends of the taper. Accordingly, the top portion of the gate cut isolation region 550 has an upper area having a width that is substantially larger than a width of a bottom area of the top portion of the gate cut isolation region 550, with the profile discontinuity occurring at the intersection 562 at substantially the same level as a top surface of the uppermost semiconductor channel layer 108. The bottom portion of the gate cut isolation region 550 has a substantially constant width from top to bottom.

It should be noted that although embodiments of the present disclosure are described with reference to the formation of a gate cut isolation structure in a nanosheet FET, the previously described embodiments are capable of being implemented in the formation of other type of isolation structures and/or deep trenches (e.g., high-aspect ratio contacts) in a nanosheet FET or any other type of FET device.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a gate cut isolation region located between adjacent fin regions extending vertically from a semiconductor substrate, the gate cut isolation region including a top portion formed in a top material above and fully covering the fin regions and a bottom portion formed in a bottom material different from and below the top material and which is laterally between the fin regions, the top portion of the gate cut isolation region being at a first taper angle and the bottom portion of the gate cut isolation region being at a second taper angle different from the first taper angle; and
an intersection between the top portion of the gate cut isolation region and the bottom portion of the gate cut isolation region, wherein a change from the first taper angle to the second taper angle occurs at the intersection.

2. The semiconductor structure of claim 1, further comprising:
a plurality of semiconductor channel layers in the fin regions adjacent to the gate cut isolation region, the plurality of semiconductor channel layers being surrounded by a metal gate stack.

3. The semiconductor structure of claim 2, wherein the intersection between the top portion of the gate cut isolation region and the bottom portion of the gate cut isolation region is coplanar with a top surface of an uppermost semiconductor channel layer.

4. The semiconductor structure of claim 1, wherein the top portion of the gate cut isolation region includes top sidewalls having a first slope angle measured from a horizontal plane and the bottom portion of the gate cut isolation region includes bottom sidewalls with a second slope angle different from the first slope angle.

5. The semiconductor structure of claim 4, wherein the first slope angle is less than the second slope angle measured from the horizontal plane, wherein the second slope angle is approximately 90 degrees.

6. The semiconductor structure of claim 1, wherein a width of an upper area of the top portion of the gate cut isolation region is larger than a width of a bottom area of the top portion of the gate cut isolation region.

7. The semiconductor structure of claim 1, wherein the bottom portion of the gate cut isolation region has a substantially constant width from top to bottom.

8. A method of forming a semiconductor structure, comprising:
forming a gate cut isolation region between adjacent nanosheet fins on a semiconductor substrate, the gate cut isolation region including a top portion formed in a top material above and fully covering the fin regions and a bottom portion formed in a bottom material different from and below the top material and which is laterally between the fin regions, the top portion of the gate cut isolation region being at a first taper angle and the bottom portion of the gate cut isolation region being at a second taper angle, the first taper angle of the top portion being different from the second taper angle of the bottom portion, wherein a change from the first taper angle to the second taper angle occurs at an intersection between the top portion of the gate cut isolation region and the bottom portion of the gate cut isolation region.

9. The method of claim 8, wherein forming the gate cut isolation region further comprises:

forming a plurality of nanosheet fins extending from the semiconductor substrate, each of the plurality of nanosheet fins separated by a shallow trench isolation region.

10. The method of claim 9, further comprising:

forming a first dummy gate material surrounding each of the plurality of nanosheet fins, a top surface of the first dummy gate material is coplanar with a top surface of each of the plurality of nanosheet fins; and forming a second dummy gate material above the first dummy gate material and the top surface of the plurality of nanosheet fins.

11. The method of claim 10, wherein an etch rate of the first dummy gate material is higher than an etch rate of the second dummy gate material.

12. The method of claim 10, wherein the first dummy gate material comprises at least one of silicon germanium with at least 80 atomic percent germanium and germanium, and the second dummy gate material comprises amorphous silicon.

13. The method of claim 10, further comprising:

planarizing the second dummy gate material;

depositing a hardmask layer above the second dummy gate material; and patterning the second dummy gate material.

14. The method of claim 13, further comprising:

forming a gate hardmask above the second dummy gate material; and forming a trench extending through the second dummy gate material and the first dummy gate material.

15. The method of claim 14, wherein a difference between the etch rate of the first dummy gate material and the etch rate of the second dummy gate material creates a profile discontinuity at an interface between the first dummy gate material and the second dummy gate material.

16. The method of claim 14, wherein the intersection between the top portion of the gate cut isolation region and the bottom portion of the gate cut isolation region is coplanar with a top surface of an uppermost semiconductor channel layer.

17. The method of claim 14, wherein the top portion of the gate cut isolation region includes top sidewalls having a first slope angle measured from a horizontal plane and the bottom portion of the gate cut isolation region includes bottom sidewalls with a second slope angle different from the first slope angle, wherein the first slope angle is less than the second slope angle measured from the horizontal plane, wherein the second slope angle is approximately 90 degrees.

18. The method of claim 17, wherein a change from the first slope angle to the second slope angle occurs at the interface between the first dummy gate material and the second dummy gate material which is located at substantially the same level as the top surface of each of the plurality of nanosheet fins.

19. The method of claim 14, further comprising:

filling the trench with a dielectric material.

20. The method of claim 14, further comprising:

selectively removing the first dummy gate material and the second dummy gate material; and replacing the first dummy gate material and the second dummy gate with a metal gate stack.

* * * * *